(12) United States Patent
Lilley et al.

(10) Patent No.: US 12,165,303 B2
(45) Date of Patent: Dec. 10, 2024

(54) PROGRESSIVE DAMAGE AND FAILURE ANALYSIS OF METAL PARTS USING COMPUTED TOMOGRAPHY

(71) Applicant: The Boeing Company, Chicago, IL (US)

(72) Inventors: Bryan Lilley, Saint Louis, MO (US); Brittan A. Farmer, Madison, AL (US); Troy Winfree, Seattle, WA (US); Yadan Wu, Bellevue, WA (US); Brian P. Justusson, Saint Peters, MO (US); Jordan A. Severson, Saint Peters, MO (US)

(73) Assignee: The Boeing Company, Chicago, IL (US)

( * ) Notice: Subject to any disclaimer, the term of this patent is extended or adjusted under 35 U.S.C. 154(b) by 379 days.

(21) Appl. No.: 17/664,463

(22) Filed: May 23, 2022

(65) Prior Publication Data

US 2023/0401686 A1 Dec. 14, 2023

(51) Int. Cl.
*G06T 7/00* (2017.01)
*G06F 30/15* (2020.01)

(52) U.S. Cl.
CPC ............ *G06T 7/0004* (2013.01); *G06F 30/15* (2020.01); *G06T 2207/10072* (2013.01)

(58) Field of Classification Search
CPC . H04L 1/18; G06N 7/005; G06N 3/02; G05B 23/0294; G05B 19/41885; G06T 7/0004; G06T 2207/10072; G06F 30/15; B29C 64/393; B29C 64/112; B33Y 50/02; B33Y 30/00; G06Q 10/063118
See application file for complete search history.

(56) References Cited

U.S. PATENT DOCUMENTS

| 11,255,825 | B2 | 2/2022 | Georgeson et al. |
| 2021/0012544 | A1* | 1/2021 | Lee .................. G06T 11/008 |
| 2023/0296797 | A1* | 9/2023 | Ma .................... G01N 29/227 73/825 |

FOREIGN PATENT DOCUMENTS

| CN | 112818582 A | 5/2021 |
| DE | 102018109546 A1 | 10/2019 |

* cited by examiner

*Primary Examiner* — Phuoc H Doan
(74) *Attorney, Agent, or Firm* — Quinn IP Law

(57) ABSTRACT

A computer-based method for evaluating progressive damage in a metal test component includes providing Computed Tomography (CT) image data of the component to a processor and processing the CT image data via the processor, including detecting observable defects in the component. The method also includes characterizing the observable defects into corresponding defect categories, generating a data table of the observable defects and the corresponding defect categories, and embedding a collective set of data from the data table into a finite element model (FEM) of the component to thereby construct a modified FEM of the metal test component. Additionally, the method includes analyzing the modified FEM through an isotropic and/or anisotropic structural model, via the processor, to thereby generate a set of test results. A quality control action is then executed with respect to the metal test component based on the test results.

20 Claims, 4 Drawing Sheets

PROGRESSIVE DAMAGE AND FAILURE ANALYSIS OF METAL PARTS USING COMPUTED TOMOGRAPHY

BACKGROUND

Machine parts and other components having relatively complex internal or external surface geometries can be constructed in a layer-by-layer manner using a process referred to in the art as additive manufacturing or three-dimensional (3D) printing. Additive manufacturing processes are used to fabricate 3D-printed components during rapid prototyping efforts, as well as to fabricate out-of-production or low volume replacement parts. However, evolving high-resolution scanning techniques and 3D printing equipment for use with metal powder feedstock have allowed additive manufacturing to become a viable higher volume production alternative, with production costs comparing favorably to traditional metal forming processes such as casting, forging, and injection molding.

3D-printed components produced by powder bed fusion (PBF) and other metal-based additive manufacturing processes provide tremendous utility across a myriad of different industries and applications, including but not limited to the manufacturing of specialized lower weight/higher strength aerospace parts such as propulsion system nozzles, fuel combustion chambers, and turbine fan blades. As with other complex metal parts formed using competing traditional technologies such as casting or forging, 3D-printed components are often evaluated during design and testing stages of production using finite element analysis techniques, with modeled test components subjected to rigorous validation processes. Subjecting the test component to rigorous non-destructive testing and evaluation helps ensure that manufactured embodiments of the test component ultimately meet relevant performance standards.

SUMMARY

Disclosed herein are computer-based processes and associated computer hardware and software that collectively facilitate non-destructive evaluation of metal test components, including three dimensional (3D)-printed components and wrought metal parts. In particular, the described techniques employ Computed Tomography (CT) in conjunction with a finite element model (FEM) to collect CT image data of a metal test component, and to thereafter process the collected CT image data when evaluating progressive damage such as crack propagation. Ultimately, a generated set of test results is used to selectively modify one or more aspects of the underlying formation process to prevent reoccurrence of particular flaws or defects such as inclusions, voids, or cracks, and/or to selectively scrap or accept the test components or representative production runs thereof.

As appreciated in the art, CT scanning involves the targeted use of narrow-band x-ray energy during non-destructive inspection of a test component. Compared to competing NDE techniques, CT provides highly detailed quality inspection scans in a layer-specific manner. Using CT images, for instance, users are better able to examine material samples, observe sizes, shapes, and locations of voids, inclusions, or other internal defects, and evaluate internal density variations, among other things. Thus, CT-based imaging—traditionally reserved for medical imaging—now benefits a range of modern manufacturing processes. An exemplary 3D-printed aerospace component as described herein is just one possible embodiment of the test component within the scope of the present disclosure. Rather than evaluating two-dimensional (2D) image slices from the CT images, however, the present approach works in concert with finite element analysis and the above noted FEM to embed the defects into the FEM for forward-looking damage projections.

As described generally above and appreciated in the art, a 3D-printed component is progressively constructed layer-by layer, for example in a build tank of a powder bed fusion system using a laser beam, electron beam, or other suitable concentrated heat source. It is recognized herein that conventional NDE processes for inspecting a finished 3D-printed part tend to be suboptimal in terms of understanding the many intricate microstructural differences present in a given part, and how such differences ultimately affect global structural behavior of the test component. At present, verified material models and analytical tools are suboptimal for investigating crack growth on a miniscule length scale of a typical AM defect. Thus, 3D-printed and wrought metal components having a large number of defects and high variability in their underlying build processes very often require costly build-test programs. This is especially true in certain highly regulated industries such as aircraft manufacturing. The proposed solutions therefore are intended to reduce testing needs and required iterations, e.g., during component-level certification, while continuing to ensure compliance with relevant standards.

To this end, a computer-based methodology is described herein that can be used for evaluating metallic 3D-printed or wrought parts, hereinafter referred to as a "metal test component" for simplicity. Such components are prone to certain microscopic defects during manufacturing. The provided solutions may be used to evaluate manufacturing processes and rapidly predict performance without extensive testing of physical embodiments of the test component. In general, CT data is collected from the test component and used to identify, characterize, and embed defects into an FEM, e.g., via an algorithm or computer-executable code implemented in PYTHON or another suitable programming language. The FEM includes a model, e.g., an isotropic structure model, to enable the embedded defects and the surrounding materials to be subjected to detailed failure analysis. Additionally, the present methodology enables end-to-end analysis from inspection of an as-built part up to failure prediction, and also enables research techniques for evaluating the effects of defects without physical testing. Collectively, the present teachings allow users to avoid manufacturing processes having a higher likelihood of resulting in defects that significantly reduce structural performance under static and/or fatigue loading conditions.

Aspects of the present method include the automated characterization of a defect as a particular defect type, e.g., a void or an inclusion, along with associated sizes, shapes, and/or locations of the characterized defects within the test component.

In an exemplary embodiment, a computer-based method for evaluating progressive damage in a metal test component includes providing CT image data of the metal test component to a processor, and then processing the CT image data via the processor, including detecting observable defects in the metal test component. The method includes characterizing the observable defects into a plurality of corresponding defect categories, generating a data table of the observable defects and the corresponding defect categories, and embedding a collective set of data from the data table into an FEM of the metal test component to thereby construct a modified FEM of the metal test component. Additionally, the method may include analyzing the modified FEM through an isotropic and/or anisotropic structural model, via the processor, to thereby generate a set of test results, and thereafter executing a quality control action with respect to the metal test component based on the set of test results.

Characterizing the observable defects into the corresponding defect categories may include constructing a registry of distributions of locations, sizes, and/or shapes of the observable defects as summarized above. Analyzing the modified FEM through the isotropic and/or anisotropic structural model may include using one or more of an isotropic elastic model, an isotropic plasticity model, or anisotropic plasticity model.

Executing the quality control action with respect to the metal test component based on the set of test results may include modifying a design of the metal test component and/or modifying a manufacturing process by which the metal test component was constructed.

The metal test component in some implementations may be a 3D-printed part constructed using an additive manufacturing process, in which case modifying the manufacturing process includes modifying the additive manufacturing process. In other applications the component is a wrought metal part.

An aspect of the disclosure includes providing CT image data of the metal test component to the processor in the form of 3D image data, in which case processing the CT image data via the processor may include generating 2D image slices from the 3D image data.

A computer system is also disclosed herein. An embodiment of the computer system includes a processor and a computer readable storage medium on which is recorded an instruction set executable by the processor. Executing the instruction set causes the processor to receive CT image data of a metal test component, process the CT image data via the processor to thereby detect observable defects in the metal test component, and characterize the observable defects into a plurality of corresponding defect categories. Executing the instruction set also causes the processor to generate a data table of the observable defects and the corresponding defect categories, embed a collective set of data from the data table into an FEM of the metal test component to thereby construct a modified FEM of the metal test component, and analyze the modified FEM through an isotropic and/or anisotropic structural model, via the processor, to thereby generate a set of test results, as well as execute a quality control action with respect to the metal test component based on the test results.

Another aspect of the present disclosure includes a computer-based method for evaluating progressive damage in a 3D-printed part. An embodiment of this method includes providing CT image data of the 3D-printed part to a processor, processing the CT image data via the processor, including detecting observable defects in the 3D-printed part, and characterizing the observable defects into a plurality of corresponding defect categories, including constructing a registry of distributions of locations and sizes of the observable defects. The method in accordance with an embodiment includes generating a data table of the observable defects and the corresponding defect categories, embedding a collective set of data from the data table into an FEM of the metal test component to thereby construct a modified FEM of the 3D-printed part, and analyzing the modified FEM through an isotropic and/or anisotropic structural model, via the processor, to thereby generate a set of test results, including using one or more of an isotropic elastic model, an isotropic plasticity model, or anisotropic plasticity model. Thereafter, the processor executes a quality control action with respect to the 3D-printed part based on the test results.

The above summary is not intended to represent every embodiment or every aspect of the present disclosure. Rather, the foregoing summary merely provides an illustration or exemplification of some of the novel concepts and features set forth herein. The above-noted and other features and advantages will be readily apparent from the following detailed description of illustrated embodiments and representative modes for carrying out the disclosure when taken in connection with the accompanying drawings and appended claims. Moreover, the present disclosure expressly includes combinations and sub-combinations of the various elements and features presented herein.

Figure 1:
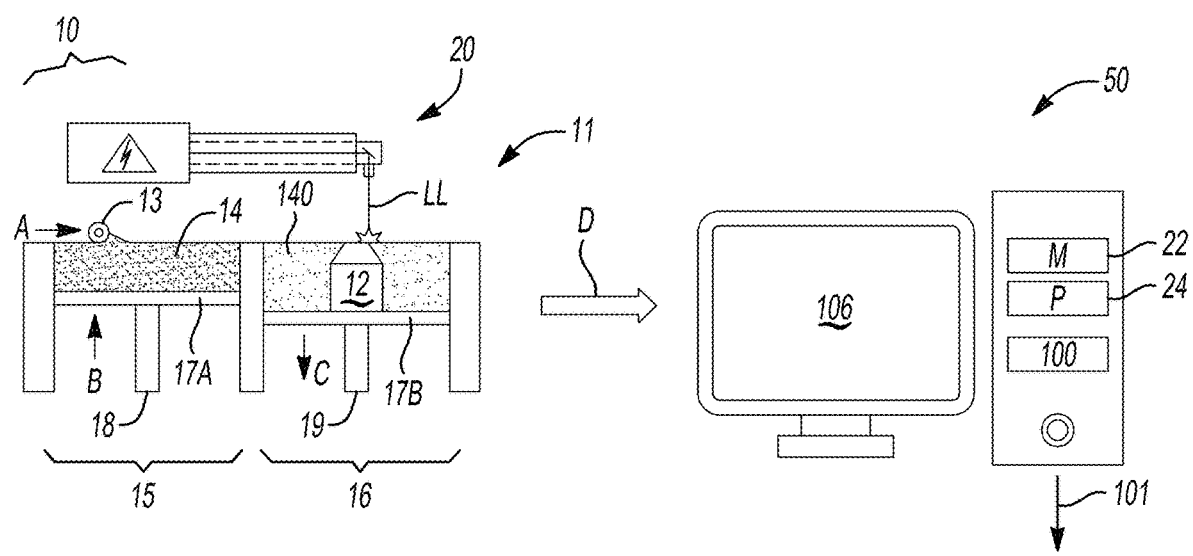
FIG. 1 is a schematic illustration of a representative computer system operable for determining progressive damage and performing failure analysis of a test component using Computed Tomography (CT) images.

The present disclosure may be extended to modifications and alternative forms, with representative embodiments shown by way of example in the drawings and described in detail below. Inventive aspects of the disclosure are not limited to the disclosed embodiments. Rather, the present disclosure is intended to cover modifications, equivalents, combinations, and alternatives falling within the scope of the disclosure as defined by the appended claims.

DETAILED DESCRIPTION

This disclosure is susceptible of embodiment in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Additionally, the term "exemplary" as used herein means "serving as an example, instance, or illustration", and thus does not indicate or suggest relative superiority of one disclosed embodiment relative to another. Words of approximation such as "about", "substantially", "approximately", and "generally" are used herein in the sense of "at, near, or nearly at", "within ±5% of", "within acceptable manufacturing tolerances", or a logical combination thereof.

Figure 2:
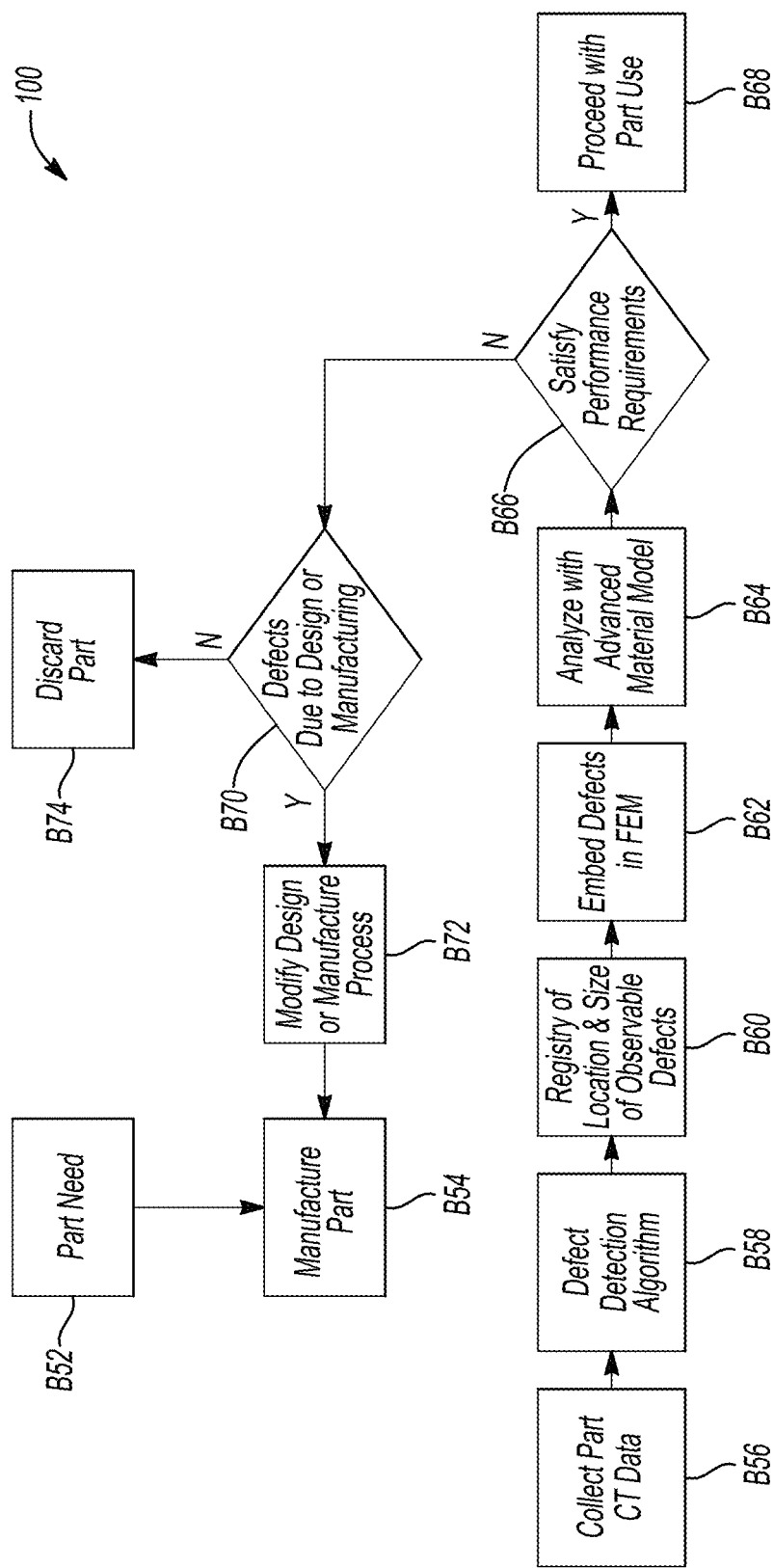
FIG. 2 is a flow chart describing an embodiment of a method in accordance with the disclosure.

Referring to the drawings, wherein like reference numbers refer to like features throughout the several views, FIG. 1 schematically depicts an exemplary additive manufacturing (AM) process 10 and a computer system 50. The computer system 50 is configured as set forth herein to execute an instruction set embodying a method 100, an example of which is shown in FIG. 2 and described in detail below. Execution of the method 100 allows the computer system 50 to evaluate progressive damage in a metal test component 12, e.g., a three-dimensional (3D)-printed part or a wrought metal part such as an aircraft or spacecraft component ("aerospace component"), a medical component, or another industry-specific component constructed of metal, and to quantify the same as a set of test results 101. While aluminum and titanium are two exemplary metals within the scope of the aforementioned aerospace and medical industries, other metals or metal alloys may be used in alternative embodiments, such as martensitic or austenitic stainless steel. Thus, the metal test component may be constructed of aluminum, stainless steel, or titanium in a non-limiting implementation of the present teachings.

The metal test component 12 contemplated herein can in one or more embodiments be constructed via the additive manufacturing process. As will be appreciated by those of ordinary skill in the art, metal-based additive manufacturing or "3D printing" can entail the use of a powder bed fusion process 11 and a concentrated heat source 20, such as but not limited to an electron or laser formation beam LL as shown. Use of the beam LL progressively melts metal powder stock 14 and thereby builds the metal test component 12 in an accumulative or progressive/layer-by-layer manner. The powder bed fusion process 11 shown in FIG. 1 may position a volume of the metal powder stock 14 on a moveable supply platform 17A within a powder feed chamber 15, with a leveling roller 13 possibly translating across the powder feed chamber 15 in the direction of arrow A. This motion enables the leveling roller 13 to displace a thin layer of the metal powder stock 14 toward an adjacent build chamber 16 as the supply platform 17A rises in the direction of arrow B, e.g., using a hydraulic or pneumatic piston 18.

Figure 3:
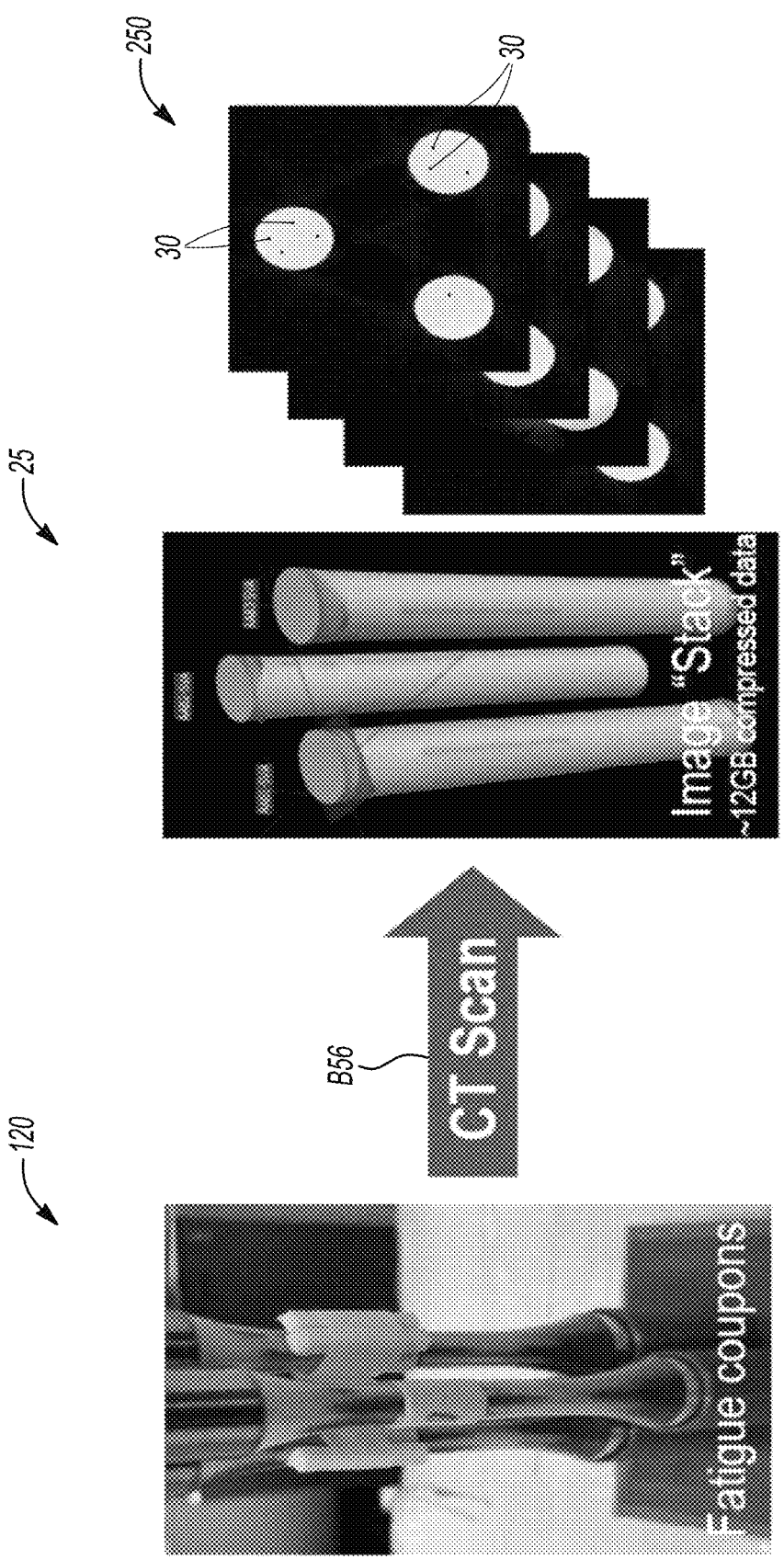
FIG. 3 is a process flow diagram describing use of CT imaging process to generate a 3D image stack of compressed image data and 2D sectional images as part of the method of FIG. 2.

Once the leveling roller 13 has deposited some of the metal powder stock 14 onto a moveable build platform 17B or a previously formed layer of the test component 12, the heat source 20 directs the beam LL onto the deposited metal powder stock 14 according to a predetermined pattern to thereby construct a layer of the test component 12. The build platform 17B is then lowered in the direction of arrow C using a piston 19 or another suitable mechanism to enable another layer of the metal test component 12 to be formed. The piston 19 is analogous to the piston 18, but is actuated in the opposite direction. The process repeats until the metal test component 12 has been fully printed, at which point residual powder stock 140 is carefully removed, e.g., via vibration, rinsing, suction, etc. A typical embodiment of the test component 12 is represented in FIG. 3 as a set of fatigue coupons 120 and described in further detail below. Thus, the metal test component 12 is ultimately evaluated as a test sample by the computer system 50 and corresponding method 100 as indicated by arrow D.

While the computer system 50 of FIG. 1 is depicted as a unitary computer module for illustrative simplicity, the computer system 50 can be physically embodied as one or more processing nodes having a computer-readable storage medium (M) 22, i.e. application-sufficient memory, and associated hardware and software, such as but not limited to a high-speed clock, timer, input/output circuitry, buffer circuitry, and the like. The computer-readable storage medium 22 may include sufficient amounts of read only memory, for instance magnetic or optical memory. Computer-readable code or instructions embodying the method 100 may be executed during operation of the computer system 50. To that end, the computer system 50 may encompass one or more processors (P) 24, e.g., logic circuits, application-specific integrated circuits (ASICs), central processing units, microprocessors, and/or other requisite hardware as needed to provide the programmed functionality described herein. A display screen 106 may be connected to or in communication with the memory 22 and processor(s) 24 to facilitate intuitive graphical presentation of the results of method 100 as set forth below.

Referring to FIG. 2, the method 100 of the present disclosure may be embodied as an instruction set or algorithm, constituent steps or logic blocks of which are executed by the computer system 50 of FIG. 1. In some embodiments, execution of this instruction set, hereinafter referred to as the method 100 for simplicity, ultimately causes the processor 24 to execute or request a quality control action with respect to the metal test component 12 based on the test results 101, e.g., by requesting a modification to a design of the metal test component 12 and/or its underlying manufacturing process as set forth below. Likewise, execution of the method 100 enables a user to evaluate microstructural differences as a result of the additive manufacturing process 10 of FIG. 1, and to ultimately ascertain how such differences affect global structural behavior of the test component 12. As noted above, the high number of potential defects and degree of variability in the additive manufacturing process 10 often requires a costly build-test program before using production versions of the metal test component 12 in an end system, e.g., an airplane or spacecraft. Thus, the method 100 is intended to reduce the need for test iterations during certification of the metal test component 12.

Beginning with block B52 ("Part Need"), the method 100 includes defining the physical characteristics of the metal test component 12. Block B52 may include specifying materials of construction, length, width, thickness, and other relevant internal and external dimensions, surface geometries, etc., as appreciated in the art. For simplicity, the metal test component 12 is shown as the set of fatigue coupons 120 of FIG. 4, which in turn are representative cylinders of a particular metal part for the purpose of illustration. The method 100 proceeds to block B54 once the metal test component 12 has been defined.

Block B54 ("Manufacture Part") entails creating the metal test component 12 that was previously specified in block B52. Block B54 in a representative approach includes using the above-described additive manufacturing process 10 of FIG. 1 to construct the metal test component 12 as a 3D-printed part, or constructing the metal test component 12 as a wrought part as noted above. The method 100 proceeds to block B56 when a physical specimen of the metal test component 12 has been constructed.

Block B56 includes providing Computed Tomography (CT) image data 25 of the metal test component 12 to the processor 24 of the computer system 50 shown in FIG. 1. For example, the computer system 50 may be in communication with a CT scanning device (not shown) and operable to receive the CT image data 25 in real-time or, or the CT image data 25 could be uploaded or transmitted to the computer system 50 as an input file in different implementations. Referring briefly to FIG. 3, for instance, the representative fatigue coupons 120 may be subjected to a CT scanning process to generate the CT image data 25 as an image stack of compressed 3D images as shown. The computer system 50 may thereafter digitally divide or "slice" the compressed 3D images into 2D images 250 as shown. Advanced software commonly used to analyze CT images is able to interrogate each volumetric pixel ("voxel") for inclusions, voids, or other defects. For simplicity, the CT image data 25 will be described hereinafter as the 3D images 25 to differentiate dimensionally from the 2D images 250.

For example, the 3D images of the CT image data 25 and/or the 2D images 250 can be processed via the processor 24 of FIG. 1 to detect observable defects in the metal test component 12. As appreciated in the art, the automated creation of CT data and extraction of layer-by-layer 2D images is well understood in the medical imaging, and may be readily extended to the present aerospace application and other suitable applications. The method 100 proceeds to block B58 once the noted 2D images 250 have been collected and temporarily stored in memory 22 of the computer system 50 shown in FIG. 1.

Block B58 ("Defect Detection Algorithm") of the method 100 depicted in FIG. 3 includes processing the 2D images 250 through an application suitable defect detection algorithm, statistical mode, or screen to identify anomalies in the 3D or 2D images 25 or 250. Non-limiting approaches for implementing block B58 include applying digital filters to the constituent voxels or pixels in the 3D or 2D images 25 or 250, respectively, to screen for predetermined voxel or pixel qualities indicative of the defects.

Figure 4:
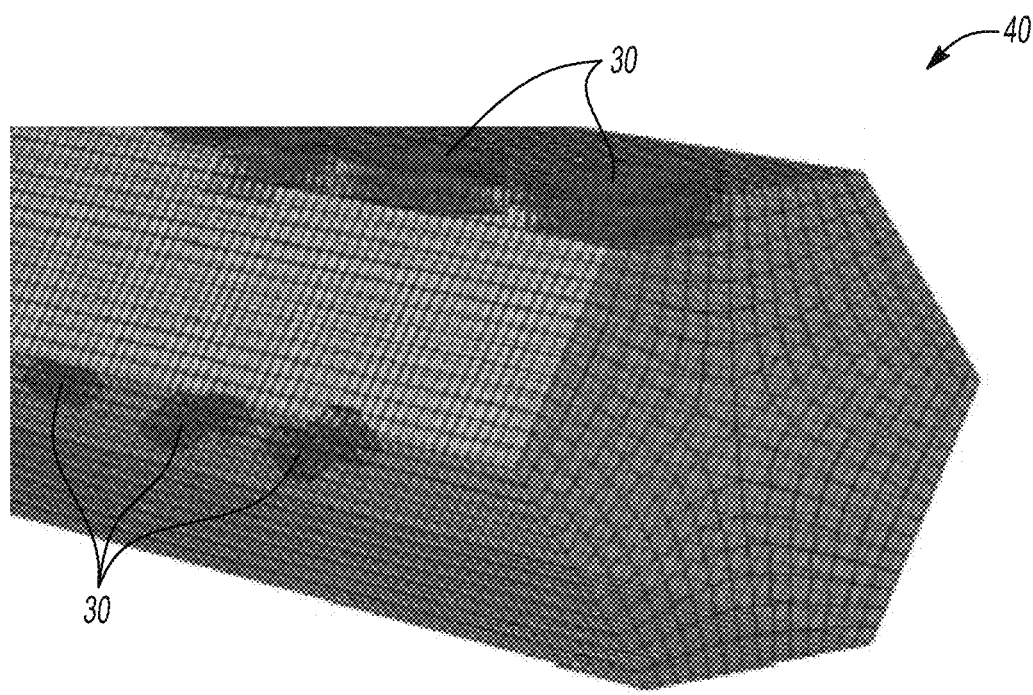
FIG. 4 is a representative finite element model (FEM) showing embedded observable defects in a test component in accordance with an aspect of the disclosure.

For example, if the metal test component 12 is a uniformly solid cylinder of a particular metal, exposure of a defect to the CT scanning process of block B56 may result voxels or pixels having an identifiably different darkness or appearance relative to surrounding voxels or pixels. Observable defects 30 are represented in FIG. 4. For instance, an observable defect 30 in the form of a void is often defined in detection software as an area of low density, i.e., an air pocket, surrounded on all sides by the higher density material of the metal target component 12. Adjacent voids effectively form a larger, more easily detectable or observable void. Thus, concentrations of voids and other observable defects, i.e., observable defects 30 larger than a defined voxel or pixel screening limit, could be evaluated as a factor implicating failure modes such as crack propagation. The method 100 proceeds to block B58 once the observable defects 30 in the CT data have been properly identified.

At block B60 ("Registry of Location & Size of Observable Defects"), the computer system 50 of FIG. 1 characterizes the observable defects 30 of block B56 into a plurality of corresponding defect categories, e.g., by constructing a registry of distributions of locations, sizes, and/or shapes of the observable defects, with the computer system 50 possibly organizing the defect categories into a data table. For instance, block B58 may include outputting a library of defect sizes and locations. Outputs of block B58 may also include, e.g., a registry of defect distributions, locations, and sizes of the observable defects 30 from block B56 such as cracks, inclusions, porosity, etc. Each observable defect 30 may be assigned a number in accordance with an aspect of the disclosure to facilitate tracking and correlation of multiple defects 30 with a given failure mode such as crack propagation. The method 100 then proceeds to block B62 when the computer system 50 has properly characterized the observable defects 30 of block B56 into a plurality of corresponding defect categories, e.g., as embodied by the aforementioned data table.

Still referring to FIG. 3, block B62 ("Embed Defects in FEM") entails embedding the data table or other relevant output files from block B60 into a finite element model (FEM) of the metal test component 12. In this manner, the computer system 50 constructs a modified FEM of the metal test component 12. A portion of such a representative discretized coupon volume or modified FEM 40 is shown in FIG. 4, with observable defects 30 represented therein.

"Embedding" in the context of performing block B62 therefore entails representing a collective set of the specific observable defects 30 in terms of one or more of a corresponding size, shape, or location within the metal test object 12, defect type, etc., within a nodal/mesh wire frame of the modified FEM 40. As appreciated, an FEM such as the modified FEM 40 is comprised of a plurality of nodes or voxels each having corresponding coordinates, such that the coordinates of each respective one of the observable defects 30 can be mapped into a grid or mesh to the original discretized model of the metal test component 12, thus creating the modified FEM 40 for use in the present method 100. In other words, outputs from the defect detection process of block B58 are used directly as inputs to create the modified FEM 40, e.g., via ABAQUS scripting methods. The method 100 then proceeds to block B64.

Figure 5:
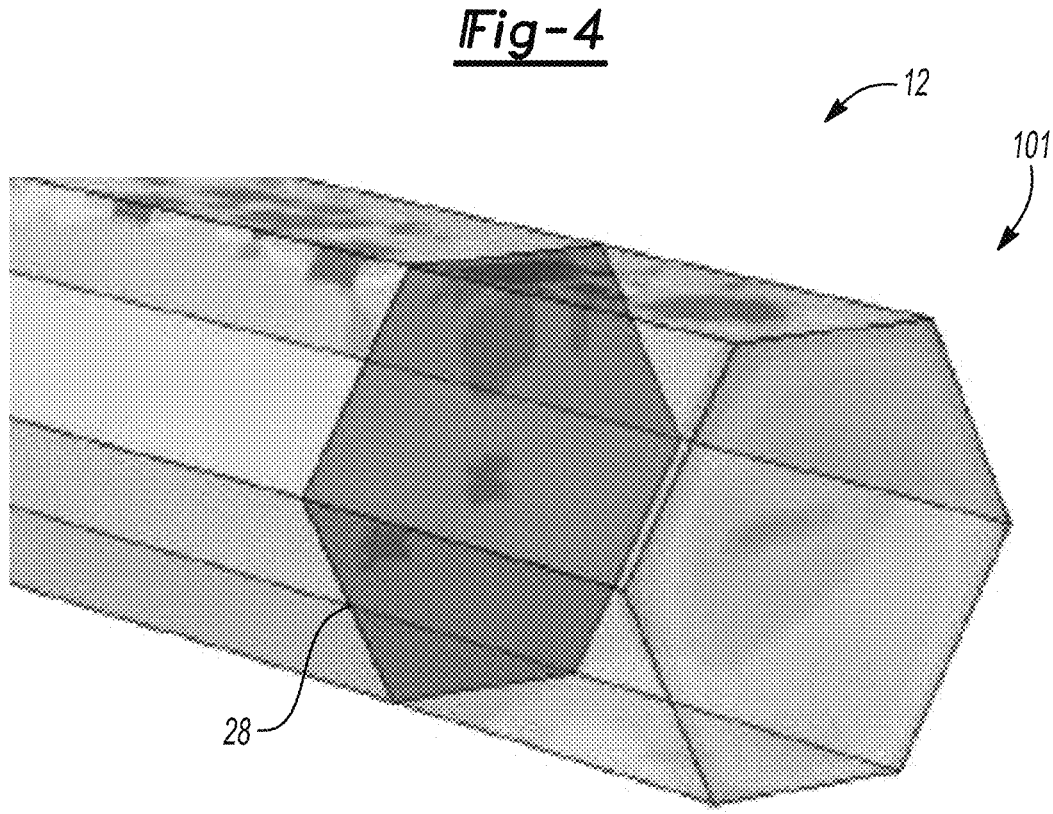
FIG. 5 is an illustration of demonstrated effects of the observable defects of FIG. 5 on the test component.

Block B64 ("Analyze with Advanced Material Model") includes analyzing the modified FEM 40 from block B62, exemplified in FIG. 4, through at least one isotropic and/or anisotropic structural model to generate the set of test results 101 of FIG. 1. For instance, the test results 101 of FIG. 5 represent, in simplified form, demonstrated effects of the various observable defects 30 on the structural behavior of the metal test component 12. For example, a segment 28 may be analyzed to show that stress rises in some areas of the metal test component 12 as a result of the observable defects 30 of FIG. 4.

Block B64 may be performed by the processor 24 of FIG. 1 using various possible models. For example, using the model nomenclature A=elasticity, B=plasticity, C=failure criterion, and D=energy release as well understood in the art, the computer system 50 may analyze the modified FEM 40 through one or more of an isotropic elastic model (e.g., ACD), an isotropic plastic model (e.g., ABCD), an anisotropic elastic model (e.g., ACD), or an anisotropic plastic model (e.g., ABCD). Other models could also be used, such as ABC, ACD, or AC, without limitation.

An exemplary model that may be used as part of block B64 in a non-limiting embodiment may include by way of example one or more predetermined models of stress, initial crack size, and fracture energy to enable static and fatigue analysis on existing or "virtual" embodiments of the test component 12. Useful models may incorporate linear elastic fracture mechanics (LEFM) or other relevant principles to fully describe the probabilistic behavior of the metal test component 12 in response to certain discrete observable defects 30 or concentrations of the same, with FIG. 5 once again graphically representing test results 101 in this way. The present approach thus permits evaluation of strength/life knockdowns due to interior and/or surface defects and determination of critical defect sizes/locations that will inform manufacturing and design decisions.

A goal of block B64 is to achieve predictive capability between stress-based initiation through short crack growth dominated by stress mechanics, and to demonstrate crack growth and propagation through the fast fracture regime of LEFM. In the present analysis, the observable defects 30 are on a much smaller scale than is captured in the various models. Thus, the advanced material model(s) used in block B64 acts as a unifier of the different length scales, i.e., of the observable defects 30 and the underlying FEM (see FIG. 4). The method 100 then proceeds to block B66.

At block B66 ("Satisfy Performance Requirements?"), the method 100 includes executing a quality control action with respect to the metal test component 12, with this action occurring in response to or based on the test results 101 of FIG. 1. By way of example and not limitation, the computer system 50 of FIG. 1 may use its processor 24 to compare the test results 101 to requirements, i.e., a predetermined set of threshold performance values that the metal test component 12 must comply with in order to be validated for use in its intended application. Block B68 may include determining, via the processor 24, whether the test results 101 are sufficient for validating the test component 12 for its intended application. When this is the case, the method 100 proceeds to block B68. Alternatively, the method 100 proceeds to block B70 when the test results 101 do not satisfy the performance requirements.

Block B68 ("Proceed with Part Use") includes using the metal test component 12 in its intended application. The method 100 is then complete, resuming anew at block B52 with a subsequent part need, or with a modification to the design of the test component 12.

At block B70 ("Defects Due to Design or Manufacturing?"), the computer system 50 determines if the various observable defects 30 (see FIG. 4) are due to design or manufacturing concerns. If not, the method 100 proceeds to block B74. The method 100 otherwise proceeds to block B72.

Block B72 ("Modify Design or Manufacture Process") is arrived at when a determination is made at preceding block B70 that the defects are a result of manufacturing. When the metal test component 12 is a 3D-printed part constructed using an additive manufacturing process as noted above, block B72 may proceed by modifying the additive manufacturing process. That is, the metal test component 12 could be made in a way that would minimize or eliminate the observable defects 30, whether in number, size, concentration, or otherwise. Block B72 thus includes modifying the process to eliminate the observable defects 30. For example, observable defects 30 may be due to contaminants in the metal powder stock 14 of FIG. 1, high humidity in the build chamber, characteristics of the beam LL, or other identifiable factors. In such cases, process engineering improvements may be made in an effort to eliminate the observable defects 30. Once complete, the method 100 proceeds to the above-described block B54 for manufacture of a new and hopefully improved version of the metal test component 12.

Block B74 ("Discard Part") may be arrived at from block B70 when the identified observable defects 30 are not a result of the manufacturing process. For example, the metal test component 12 may have a particular geometry, size, or composition that makes it impossible to manufacture in accordance with requirements. In such a case, it may become necessary to redesign the part as opposed to modifying the manufacturing process. In this event, the metal test component 12 is scrapped. The method 100 then begins anew with blocks B52 and B54 as set forth above.

The method 100 described above, when executed by the computer system 50 of FIG. 1, thus improves upon the current state of the art by providing an understanding of the probable evolution and progression of observable defects 30 in a given metal test component 12. Rather than using 2D "slice-by-slice" images of a test coupon, the present approach identifies and catalogues the observable defects 30 into a database, and thereafter maps the defects to a defined 3D FEM volume for subsequent analysis. The FEM-based solutions of the present disclosure thus provide rapid physics-informed learning of damage progressive damage and failure development of metal parts, solely using CT imaging to detect defects, embed the same into a discretized FEM volume, and perform subsequent model-based analysis.

That is, the method 100 of the subject disclosure does not operate based on knowledge of the observable defects 30 alone, but rather is informed by LEFM or other relevant models to fully describe expected behaviors of the test component 12 in response to the observable defects 30 or local concentrations of the same. The present teachings thereby provide a tool for analyzing crack growth at a length scale of a typical additive manufacturing defect, unlike machine learning techniques and other existing approaches. These and other attendant benefits will be readily appreciated by those skilled in the art in view of the foregoing disclosure.

Aspects of the present disclosure have been described in detail with reference to the illustrated embodiments. Those skilled in the art will recognize, however, that certain modifications may be made to the disclosed structure and/or methods without departing from the scope of the present disclosure. The disclosure is also not limited to the precise construction and compositions disclosed herein. Modifications apparent from the foregoing descriptions are within the scope of the disclosure as defined by the appended claims. Moreover, the present concepts expressly include combinations and sub-combinations of the preceding elements and features.

What is claimed is:

1. A computer-based method for evaluating progressive damage in a metal test component, comprising:
   providing Computed Tomography (CT) image data of the metal test component to a processor;
   processing the CT image data via the processor, including detecting observable defects in the metal test component;
   characterizing the observable defects into a plurality of corresponding defect categories;
   generating a data table of the observable defects and the corresponding defect categories;
   embedding a collective set of data from the data table into a finite element model (FEM) of the metal test component to thereby construct a modified FEM of the metal test component;
   analyzing the modified FEM using an isotropic and/or anisotropic structural model, via the processor, to thereby generate a set of test results; and
   executing a quality control action with respect to the metal test component based on the test results.

2. The computer-based method of claim 1, wherein characterizing the observable defects into the plurality of corresponding defect categories includes constructing a registry of distributions of locations, sizes, and/or shapes of the observable defects.

3. The computer-based method of claim 1, wherein analyzing the modified FEM through the isotropic and/or anisotropic structural model includes using one or more of an isotropic elastic model, an isotropic plasticity model, or anisotropic plasticity model.

4. The computer-based method of claim 1, wherein the metal test component is constructed of aluminum, stainless steel, or titanium.

5. The computer-based method of claim 1, wherein executing the quality control action with respect to the metal test component includes modifying a design of the metal test component.

6. The computer-based method of claim 1, wherein executing the quality control action with respect to the metal test component includes modifying a manufacturing process by which the metal test component was constructed.

7. The computer-based method of claim 6, wherein the metal test component is a three-dimensional printed part constructed using an additive manufacturing process, and wherein modifying the manufacturing process includes modifying the additive manufacturing process.

8. The computer-based method of claim 6, wherein the metal test component is a wrought metal part.

9. The computer-based method of claim 1, wherein providing CT image data of the metal test component to the processor includes providing 3D image data to the processor, and wherein processing the CT image data via the processor includes generating 2D image slices from the 3D image data.

10. A computer system comprising:
a processor; and
a non-transitory computer readable storage medium on which is recorded an instruction set executable by the processor, wherein executing the instruction set causes the processor to:
receive Computed Tomography (CT) image data of a metal test component;
process the CT image data via the processor to thereby detect observable defects in the metal test component;
characterize the observable defects into a plurality of corresponding defect categories;
generate a data table of the observable defects and the corresponding defect categories;
embed a collective set of data from the data table into a finite element model (FEM) of the metal test component to thereby construct a modified FEM of the metal test component;
analyze the modified FEM through an isotropic and/or anisotropic structural model, via the processor, to thereby generate a set of test results; and
execute a quality control action with respect to the metal test component based on the set of test results.

11. The computer system of claim 10, wherein executing the instruction set causes the processor to characterize the observable defects into the plurality of corresponding defect categories as a registry of distributions of locations and sizes of the observable defects.

12. The computer system of claim 11, wherein the registry includes distributions of shapes of the observable defects.

13. The computer system of claim 10, wherein executing the instruction set causes the processor to analyze the modified FEM through one or more of an isotropic elastic model, an isotropic plasticity model, or anisotropic plasticity model as the isotropic and/or anisotropic structural model.

14. The computer system of claim 10, wherein executing the instruction set causes the processor to execute the quality control action with respect to the metal test component based on the test results by requesting a modification to a design of the metal test component.

15. The computer system of claim 10, wherein executing the instruction set causes the processor to execute the quality control action with respect to the metal test component based on the test results by requesting a modification to a manufacturing process by which the metal test component was constructed.

16. The computer system of claim 10, wherein executing the instruction set causes the processor to receive the CT image data of the metal test component as 3D image data, and to process the 3D image data to thereby generate 2D image slices from the 3D image data.

17. A computer-based method for evaluating progressive damage in a three-dimensional (3D)-printed metal part, comprising:
providing Computed Tomography (CT) image data of the 3D-printed metal part to a processor;
processing the CT image data via the processor, including detecting observable defects in the 3D-printed metal part;
characterizing the observable defects into a plurality of corresponding defect categories, including constructing a registry of distributions of locations, sizes, and shapes of the observable defects;
generating a data table of the observable defects and the corresponding defect categories;
embedding a collective set of data from the data table into a finite element model (FEM) of the 3D-printed metal part to thereby construct a modified FEM of the 3D-printed metal part;
analyzing the modified FEM through an isotropic and/or anisotropic structural model, via the processor, to thereby generate a set of test results, including using one or more of an isotropic elastic model, an isotropic plasticity model, or anisotropic plasticity model; and
executing a quality control action with respect to the 3D-printed part based on the set of test results.

18. The method of claim 17, wherein executing the quality control action with respect to the 3D-printed metal part includes modifying a design of the 3D-printed metal part.

19. The method of claim 17, wherein executing the quality control action with respect to the 3D-printed metal part includes modifying an additive manufacturing process by which the 3D-printed metal part was constructed.

20. The method of claim 17, wherein providing the CT image data of the 3D-printed metal part to the processor includes providing 3D image data to the processor, and wherein processing the CT image data via the processor includes generating 2D image slices from the 3D image data.

* * * * *

UNITED STATES PATENT AND TRADEMARK OFFICE
CERTIFICATE OF CORRECTION

Page 1 of 1

| | |
|---|---|
| PATENT NO. | : 12,165,303 B2 |
| APPLICATION NO. | : 17/664463 |
| DATED | : December 10, 2024 |
| INVENTOR(S) | : Bryan Lilley et al. |

It is certified that error appears in the above-identified patent and that said Letters Patent is hereby corrected as shown below:

On the Title Page

Please change:
"(72) Inventors: Bryan Lilley, Saint Louis, MO (US);
Brittan A. Farmer, Madison, AL (US);
Troy Winfree, Seattle, WA (US);
Yadan Wu, Bellevue, WA (US);
Brian P. Justusson, Saint Peters, MO (US);
Jordan A. Severson, Saint Peters, MO (US)"

To:
--(72) Inventors: Bryan Lilley, Saint Louis, MO (US);
Brittan A. Farmer, Madison, AL (US);
Troy Winfree, Seattle, WA (US);
Yadan Wu, Bellevue, WA (US);
Brian P. Justusson, Saint Peters, MO (US);
Jordan A. Severson, Saint Peters, MO (US);
Joseph Daniel SCHAEFER, Richmond Heights, MO (US)--.

Signed and Sealed this
Twenty-third Day of December, 2025

John A. Squires
*Director of the United States Patent and Trademark Office*